United States Patent
Zhang et al.

(10) Patent No.: US 10,896,938 B2
(45) Date of Patent: Jan. 19, 2021

(54) FLEXIBLE DISPLAY DEVICE HAVING CURING MATERIAL LAYER IN DIFFERENT THICKNESSES AND METHOD FOR MANUFACTURING THE SAME

(71) Applicant: Kunshan New Flat Panel Display Technology Center Co., Ltd., Kunshan (CN)

(72) Inventors: Xiuyu Zhang, Kunshan (CN); Pengle Dang, Kunshan (CN); Xiaobao Zhang, Kunshan (CN); Liwei Ding, Kunshan (CN); Haibin Jiang, Kunshan (CN); Hui Zhu, Kunshan (CN)

(73) Assignee: Kunshan New Flat Panel Display Technology Center Co., Ltd.

( * ) Notice: Subject to any disclaimer, the term of this patent is extended or adjusted under 35 U.S.C. 154(b) by 52 days.

(21) Appl. No.: 15/781,570

(22) PCT Filed: Dec. 2, 2016

(86) PCT No.: PCT/CN2016/108388
§ 371 (c)(1),
(2) Date: Jun. 5, 2018

(87) PCT Pub. No.: WO2017/114094
PCT Pub. Date: Jul. 6, 2017

(65) Prior Publication Data
US 2019/0378884 A1 Dec. 12, 2019

(30) Foreign Application Priority Data
Dec. 31, 2015 (CN) .......................... 2015 1 1028975

(51) Int. Cl.
*H01L 27/32* (2006.01)
*H01L 51/00* (2006.01)
(Continued)

(52) U.S. Cl.
CPC ...... *H01L 27/3244* (2013.01); *H01L 51/0097* (2013.01); *H01L 51/5253* (2013.01);
(Continued)

(58) Field of Classification Search
CPC combination set(s) only.
See application file for complete search history.

(56) References Cited

U.S. PATENT DOCUMENTS 9,195,108 B2 11/2015 Park et al.
2002/0139981 A1 10/2002 Young
(Continued)

FOREIGN PATENT DOCUMENTS

CN 103150965 A 6/2013
CN 104521331 A 4/2015
(Continued)

OTHER PUBLICATIONS

Korean Office Action for Application No. 10-2018-7017391 dated Sep. 20, 2019 (Brief English Translation included only).
(Continued)

*Primary Examiner* — Shaun M Campbell
*Assistant Examiner* — Suberr L Chi
(74) *Attorney, Agent, or Firm* — Lerner, David, Littenberg, Krumholz & Mentlik, LLP

(57) ABSTRACT

Disclosed are a flexible display apparatus and a manufacturing method therefor. The manufacturing method includes the steps of: manufacturing a TFT structure on a flexible substrate, the TFT structure including a non-metal layer area; successively manufacturing a display device and a thin film encapsulation layer on the TFT structure; forming a curing material layer on the thin film encapsulation layer, the curing material layer including a specific area, and a projection of the specific area on the flexible substrate overlapping with a projection of the non-metal layer area on the
(Continued)

flexible substrate; and patterning the curing material layer so that the thickness of the specific area of the curing material layer is greater than the thickness of the other area, apart from the specific area, of the curing material layer.

15 Claims, 2 Drawing Sheets

(51) Int. Cl.
    *H01L 51/52*     (2006.01)
    *H01L 51/56*     (2006.01)
    *H01L 27/12*     (2006.01)

(52) U.S. Cl.
    CPC .......... *H01L 51/56* (2013.01); *H01L 27/1218* (2013.01); *H01L 2227/323* (2013.01); *H01L 2251/5338* (2013.01); *H01L 2251/556* (2013.01); *H01L 2251/558* (2013.01)

(56) References Cited

U.S. PATENT DOCUMENTS

| | | | |
|---|---|---|---|
| 2003/0213956 | A1 | 11/2003 | Hioki et al. |
| 2006/0115231 | A1 | 6/2006 | Ishida |
| 2008/0055831 | A1 | 3/2008 | Satoh |
| 2012/0001156 | A1 | 1/2012 | Cho et al. |
| 2014/0002427 | A1 | 1/2014 | Yeo et al. |
| 2014/0042406 | A1 | 2/2014 | Degner et al. |
| 2014/0117341 | A1 | 5/2014 | Song et al. |
| 2014/0141547 | A1 | 5/2014 | Kim |
| 2014/0353630 | A1* | 12/2014 | Baek ................ H01L 27/3262 257/40 |
| 2015/0102318 | A1 | 4/2015 | Lee |
| 2015/0115233 | A1 | 4/2015 | Kim |
| 2015/0263312 | A1 | 9/2015 | Kanegae |
| 2017/0154937 | A1 | 6/2017 | Kang |

FOREIGN PATENT DOCUMENTS

| | | | |
|---|---|---|---|
| CN | 104576687 | A | 4/2015 |
| CN | 105024018 | A | 11/2015 |
| DE | 102013111943 | A1 | 4/2014 |
| JP | 2003330004 | A | 11/2003 |
| JP | 2004519866 | A | 7/2004 |
| JP | 2016224118 | A | 12/2016 |
| KP | 1020150124816 | A | 11/2015 |
| KR | 20080041948 | A | 5/2008 |
| KR | 20140055606 | A | 5/2014 |
| KR | 20150043791 | A | 4/2015 |
| KR | 20150049258 | A | 5/2015 |
| TW | 200621068 | A | 6/2006 |
| TW | 201401131 | A | 1/2014 |
| TW | 201421664 | A | 6/2014 |
| TW | 201523955 | A | 6/2015 |
| TW | 201532252 | A | 8/2015 |
| WO | 2006090434 | A1 | 8/2006 |

OTHER PUBLICATIONS

International Search Report and Written Opinion for PCT Application No. PCT/CN2016/108388 dated Mar. 8, 2017.
Search Report & First Office Action for Parallel Taiwan Patent Application No. 105140712, dated Apr. 26, 2017.
Extended Search Report of Parallel European Patent Application No. 16880884.8, dated Dec. 19, 2018, 9 pages.
The State Intellectual Property Office of People's Republic of China—First Office Action for Appl. No. 201511028975.6 dated Mar. 8, 2019.
The State Intellectual Property Office of People's Republic of China—Second Office Action for Appl. No. 201511028975.6 dated Jul. 18, 2019.
Office Action for Application No. 2018-531455 dated Jul. 26, 2019.
Japanese Office Action for Application No. JP 2018-531455 dated Mar. 26, 2020, 3 pages.
Korean Office Action for Application No. KR 10-2018-7017391 dated Apr. 7, 2020, 3 pages.

* cited by examiner

FLEXIBLE DISPLAY DEVICE HAVING CURING MATERIAL LAYER IN DIFFERENT THICKNESSES AND METHOD FOR MANUFACTURING THE SAME

CROSS REFERENCE TO RELATED APPLICATIONS

The present application is a national phase entry under 35 U.S.C. § 371 of International Application No. PCT/CN2016/108388, filed Dec. 2, 2016, which claims priority from Chinese Patent Application No. 201511028975.6 filed Dec. 31, 2015, all of which are hereby incorporated herein by reference.

TECHNICAL FIELD

The present disclosure relates to the field of display technology, and more particularly relates to a flexible display apparatus and a manufacturing method thereof.

BACKGROUND TECHNOLOGY

Flexible screen has the advantages such as thin in volume, low power consumption, improved battery life and the like. Meanwhile, based on its good bendable and flexible characteristics, the durability of flexible screen is also much higher than the conventional screen, thus reducing the probability of accidental damage to the device.

Generally, the display device of the flexible screen is film packaged. After forming the packaging layer, a protection layer is desired to be formed on the packaging layer for protecting the display. Normally, the greater the thickness of the protection layer, the better the protective effect will be; however, the greater thickness of the protection layer causes a problem of a greater bending radius, i.e., the extent of flexibility of the flexible screen becomes smaller, or the flexibility becomes worse. Therefore, it is necessary to reduce the bending radius without changing the overall thickness of the protection layer.

SUMMARY OF THE INVENTION

Accordingly, it is necessary to provide a flexible display apparatus and a manufacturing method thereof, which can address the problem of how to reduce the bending radius of the flexible screen without changing the thickness of the protection layer.

A method of manufacturing a flexible display device includes the steps of:

fabricating a thin film transistor (TFT) structure on a flexible substrate, the TFT structure including a non-metal layer region;

fabricating a display device and a film packaging layer successively on the TFT structure;

forming a curing material layer on the film packaging layer, the curing material layer including a specific region, a projection of the specific region on the flexible substrate overlapping a projection of the non-metal layer region on the flexible substrate; and patterning the curing material layer, such that the specific region of the curing material layer has a thickness greater than a thickness of other regions of the curing material layer other than the specific region.

According to the aforementioned method of manufacturing the flexible display device, the TFT structure, the display device, the film packaging layer, and the curing material layer are sequentially formed on the flexible substrate, so as to obtain the flexible display device. The TFT structure includes a non-metal layer region, such that the stress in the region where the non-metallic layer is located is relatively weak and the withstand capacity is poor. The curing material layer is directly formed on the film packaging layer as the protection layer, and the curing material layer is patterned, such that the specific region of the curing material layer has a thickness greater than a thickness of other regions of the curing material layer other than the specific region. The projection of the specific region on the flexible substrate overlaps the projection of the non-metal layer region on the flexible substrate, therefore, under the premise of not changing the thickness of the film, the stress applied to the region where the non-metallic layer is located is transferred to the other regions where the thickness of the non-metallic layer is relatively thin and has a strong withstand ability, thereby reducing the bending radius.

In one embodiment, in the forming the curing material layer on the film packaging layer, the specific region further includes a region of which a projection on the flexible substrate overlaps a projection of the display device on the flexible substrate.

In one embodiment, the TFT structure includes a deep hole region 140, and the specific region 141 further includes a region of which a projection on the flexible substrate overlaps a projection of the deep hole region 140 on the flexible substrate.

In one embodiment, in the forming the curing material layer on the film packaging layer, the curing material layer includes a first curing material layer and a second curing material layer, and the first curing material layer and the second curing material layer are successively formed on the film packaging layer.

In one embodiment, the forming the curing material layer on the film packaging layer further includes:

coating a first curing material on the film packaging layer, curing the first curing material completely according to a first curing condition to form the first curing material layer; and coating a second curing material on the first curing material layer, semi-curing the second curing material according to a second curing condition to form a semi-curing material layer.

In one embodiment, the patterning the curing material layer, such that the specific region 141 of the curing material layer has the thickness greater than the thickness of other regions of the curing material layer other than the specific region 141, includes:

patterning the semi-curing material layer by exposure and development to obtain the patterned semi-curing material layer;

curing the patterned semi-curing material layer according to a third curing condition to form the second curing material layer.

In one embodiment, the third curing condition includes: a curing temperature being 100° C., and a curing time of 0.5 to 2 hours.

In one embodiment, the first curing condition includes: a curing temperature being 100° C. to 150° C., and a curing time of 0.5 to 2 hours; the second curing condition includes: a curing temperature being 100° C. to 150° C., and a curing time of 1 to 30 minutes.

In one embodiment, the first curing material layer has a thickness of 1 to 100 µm; the second curing material layer has a thickness of 50 to 100 µm.

In one embodiment, a curing material used in the curing material layer comprises epoxy resin or acrylate.

A flexible display device includes: a flexible substrate, and a TFT structure, a display device, a film packaging layer, and a curing material layer laminated successively on the flexible substrate, wherein the TFT structure comprises a non-metal layer region, the curing material layer comprises a specific region 141, a projection of the specific region 141 on the flexible substrate overlaps a projection of the non-metal layer region on the flexible substrate, the curing material layer is patterned, and the specific region 141 of the curing material layer has a thickness greater than a thickness of other regions of the curing material layer other than the specific region 141.

According to the aforementioned the flexible display device, the curing material layer is formed on the film packaging layer, and the curing material layer is patterned, such that the flexible display device can have a relatively small bending radius without changing the thickness of the film.

DETAILED DESCRIPTION OF THE EMBODIMENTS

Figure 1:
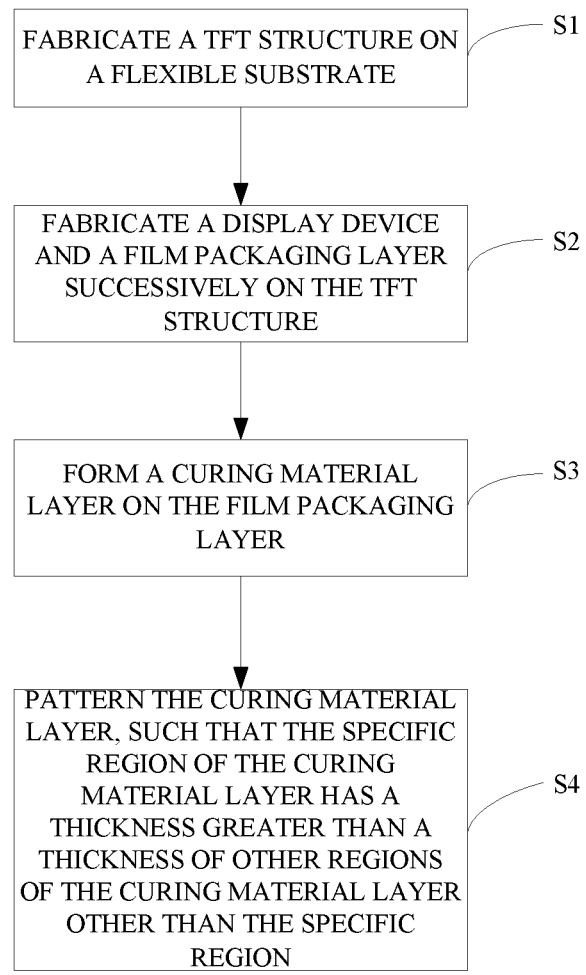
FIG. 1 is a flow chart of a method of manufacturing a flexible display device according to one embodiment.

Referring to FIG. 1, a method of manufacturing a flexible display device according to one embodiment includes the steps of:

In step S1, a thin film transistor (TFT) structure is fabricated on a flexible substrate, wherein the TFT structure includes a non-metal layer region.

Figure 2:
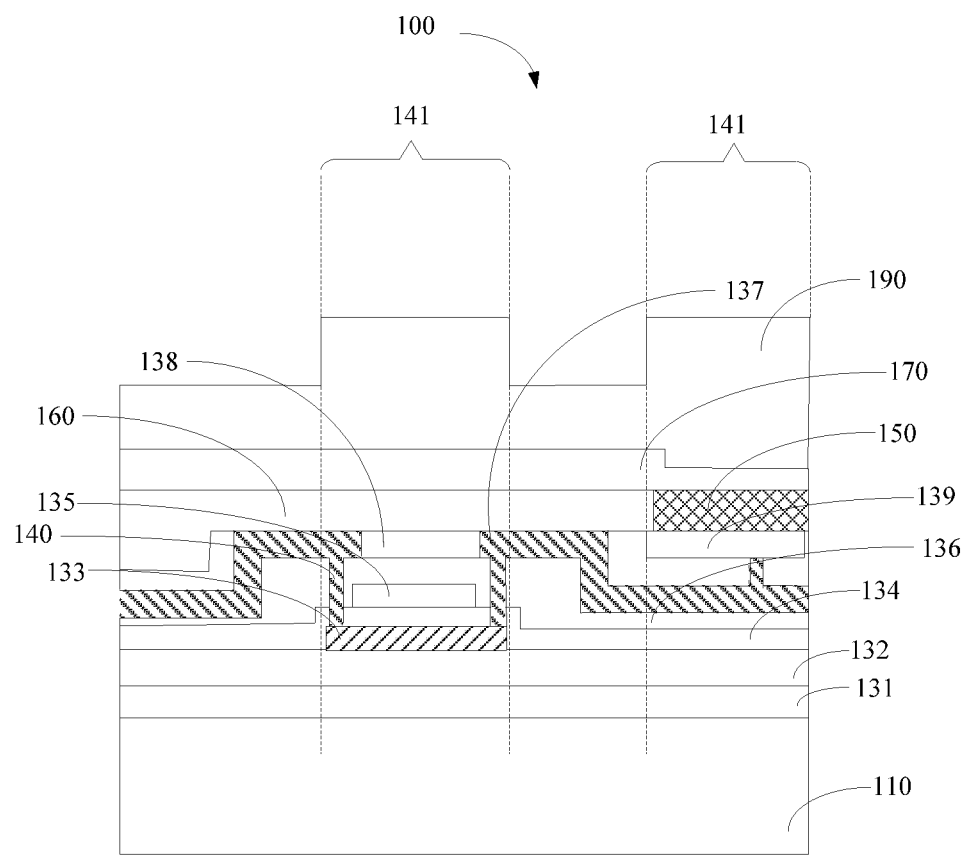
FIG. 2 is a schematic diagram of a flexible display device according to one embodiment.

Specifically, in the illustrated embodiment, referring to FIG. 2, the TFT structure is fabricated on the flexible substrate 110. The TFT structure includes a first silicon nitride layer 131 formed on the flexible substrate 110, a first silicon oxide layer 132 formed on the first silicon nitride layer 131, a polysilicon layer 133 formed on the first silicon oxide layer 132 by a screen printing method, a tetraethyl orthosilicate layer 134 located on the polysilicon layer 133, a first metal layer 135 fabricated on the tetraethyl orthosilicate layer 134, a second silicon oxide layer 136 formed on the first metal layer 135, a second metal layer 137 fabricated on the second silicon oxide layer 136, a second silicon nitride layer 138 located on the second metal layer 137, and an indium tin oxide layer 139 formed on the second silicon nitride layer 138. In the illustrated embodiment, the flexible substrate 110 is a polyimide (PI) substrate.

In the illustrated embodiment, the non-metal layer region is the polysilicon layer 133. It should be noted that, if the TFT structure further includes a deep hole region 140, then the deep hole region 140 is a region with a weak stress tolerance and is a region where stress protection is required.

The polysilicon layer 133 is fabricated by screen printing, such that the polysilicon layer 133 includes a polysilicon region. A projection of the first metal layer 135 on the flexible substrate 110 is overlapped by a projection of the polysilicon layer 133 on the flexible substrate 110. A projection of the second metal layer 137 on the flexible substrate 110 occupies all the areas that are not occupied by the projection of the polysilicon layer 133 on the flexible substrate 110.

It should be noted that, prior to fabricating the TFT structure on the flexible substrate 110, the flexible substrate 110 is attached to a glass substrate.

In step S2, a display device and a film packaging layer are successively fabricated on the TFT structure.

Specifically, in the illustrated embodiment, the display device 150 is fabricated on the indium tin oxide layer 139. In order to prevent the display device 150 from being damaged by air or water, it is necessary to fabricate the film packaging layer 170 on the display device 150. Prior to fabricating the film packaging layer 170, the whole surface is coated with a protection layer 160. Next, the film packaging layer 170 is fabricated on the protection layer 160.

In the illustrated embodiment, the display device 150 is an organic light-emitting diode (OLED) device. The film packaging layer 170 is an organic and inorganic alternating lamination film; the inorganic material can be silicon nitride or alumina, the organic material is a polymer, such as acrylate polymer.

In addition, the sum thickness of the flexible substrate 110, the TFT structure, the display device 150 is in a range of 20 μm to 25 μm.

In step S3, a curing material layer is formed on the film packaging layer.

Specifically, the curing material layer 190 is directly formed on the film packaging layer 170. The thickness uniformity of the curing material layer 190 is greater than 90%. The material used in the curing material layer 190 is a curing material having high transparency and low temperature curing. The employed curing material can be epoxy or acrylate and the like.

The curing material layer 190 includes a specific region 141, a projection of which on the flexible substrate 110 overlaps a projection of the non-metal layer region on the flexible substrate 110.

In the illustrated embodiment, other than the overlapped region of the projection on the flexible substrate 110 and a projection of the polysilicon region on the flexible substrate 110, the specific region 141 further includes an overlapped region of the projection on the flexible substrate 110 and a projection of the display device 150 on the flexible substrate 110.

It should be noted that, the specific region 141 can only be an overlapped region of the projection on the flexible substrate 110 and the projection of the polysilicon region on the flexible substrate 110, as long as a surface of the display device 150 corresponding to the second curing material layer is flat, thereby ensuring uniformity of light emission of the display device 150.

It can be inferred from step S1 that, if the TFT structure further includes a deep hole region 140, then the deep hole region 140 is a region where the stress tolerance is weak, which needs stress protection. Therefore, the foregoing specific region 141 further includes an overlapped region the projection on the flexible substrate 110 and the projection of the deep hole region 140 on the flexible substrate 110.

In the illustrated embodiment, in order to subsequently pattern the curing material 190, the curing material layer 190 is a multilayer film, for instance, a two-layers film. When the curing material layer 190 has two layers, it includes a first curing material layer and a second curing material layer. The first curing material layer has a thickness of 1 μm to 100 μm, and the second curing material layer has a thickness of 50 μm to 100 μm. The first curing material layer serves to protect the flexible display device when the second curing material layer is coated.

In the illustrated embodiment, a first curing material is manually coated on the film packaging layer 170, and the first curing material is completely cured according to a first curing condition to form the first curing material layer. The first curing condition includes: a curing temperature being 100° C. to 150° C., and a curing time of 0.5 to 2 hours; a curing temperature being 100° C. to 150° C., and a curing time of 0.5 to 2 hours. A second curing material is manually coated on the first curing material layer, and the second curing material is semi-cured according to a second curing condition to form a semi-curing material layer. The second curing condition includes: a curing temperature being 100° C. to 150° C., and a curing time of 1 to 30 minutes.

It should be noted that, when curing the second curing material, the degree of semi-curing is mainly control by the curing time.

The first curing material and the second curing material may be the same or different. In the illustrated embodiment, the first curing material and the second curing material are both epoxy resin.

It should be noted that, besides manual coating, the curing material may be coated on the film packaging layer 170 by spin coating or the like.

In step S4, the curing material layer is patterned, such that the specific region 141 of the curing material layer has a thickness greater than a thickness of other regions of the curing material layer other than the specific region 141. Specifically, in the illustrated embodiment, the semi-curing material layer in step S3 is patterned according to the position of the specific region 141 in step S3, so as to obtain the patterned semi-curing material layer. In the illustrated embodiment, the semi-curing material layer is patterned by a manner of exposure and development, such that a region of the curing material layer corresponding to the polysilicon region and the display device 150 has a thickness greater than a thickness of other regions of the curing material layer other than the polysilicon region and the display device 150, as shown in FIG. 2.

In the illustrated embodiment, the region of the curing material layer corresponding to the polysilicon region and the display device 150 has a thickness twice of a thickness of other regions of the curing material layer other than the polysilicon region and the display device 150.

The exposure process conditions are as follows: the pattern on the mask is exposed to ultraviolet light, so that the curing material is degraded for subsequent etching. The pattern is then copied to the semi-curing material layer, and is reacted with an etching solution to remove unwanted portion, thus forming a desired pattern on the semi-curing material layer. The used etching solution is ferric chloride or hydrofluoric acid.

Next, the patterned semi-curing material layer is cured according to a third curing condition to form the second curing material layer. The third curing condition includes: a curing temperature being 100° C., and a curing time of 0.5 to 2 hours.

By the described manners, the region of the curing material layer corresponding to the polysilicon region and the display device 150 (the region needs stress protection) forms an "island effect". The regions which need stress protection are put together to form a plurality of "islands", which are connected with each other via the metal wires, such that when the flexible display device is subsequently bent, the stress in these stress-weak regions is transferred to the region with a relatively thin thickness corresponding to the metal layer, thereby reducing the bending radius.

In addition, by directly coating the curing material layer 190 on the film packaging layer 170, the particles on the surface of the film packaging layer 170 are effectively protected, thus avoiding the problem of stab wounds to the film package caused by the particles.

Furthermore, in addition to the patterning process of the semi-curing material layer by the exposure development method, the semi-curing material layer can also be patterned by screen printing or heat curing.

Finally, the flexible display device is peeled off from the glass substrate. In the illustrated embodiment, laser is used for the peeling off, and the intensity of the laser was 190 to 200 mJ per square centimeter.

According to the aforementioned method of manufacturing the flexible display device, the TFT structure, the display device 150, the film packaging layer 170, and the curing material layer 190 are sequentially formed on the flexible substrate 110, so as to obtain the flexible display device 100. The TFT structure includes a non-metal layer region, such that the stress in the region where the non-metallic layer is located is relatively weak and the withstand capacity is poor. The curing material layer 190 is directly formed on the film packaging layer 170 as the protection layer, and the curing material layer 190 is patterned, such that the specific region 141 of the curing material layer 190 has a thickness greater than a thickness of other regions of the curing material layer 190 other than the specific region 141. The projection of the specific region 141 on the flexible substrate 110 overlaps the projection of the non-metal layer region on the flexible substrate 110, therefore, under the premise of not changing the thickness of the film, the stress applied to the region where the non-metallic layer is located is transferred to the other regions where the thickness of the non-metallic layer is relatively thin and has a strong withstand ability, thereby reducing the bending radius.

Referring to FIG. 2, a flexible display device 100 according to an embodiment includes the flexible substrate 110, the TFT structure located on the flexible substrate 110, the display device 150 located on the TFT structure, the film packaging layer 170 formed on the display device 150, and the curing material layer 190 located on the film packaging layer 170.

The TFT structure includes the first silicon nitride layer 131 formed on the flexible substrate 110, the first silicon oxide layer 132 formed on the first silicon nitride layer 131, the polysilicon layer 133 formed on the first silicon oxide layer 132 by a screen printing method, the tetraethyl orthosilicate layer 134 located on the polysilicon layer 133, the first metal layer 135 fabricated on the tetraethyl orthosilicate layer 134, the second silicon oxide layer 136 formed on the first metal layer 135, the second metal layer 13 fabricated on the second silicon oxide layer 136, the second silicon nitride layer 138 located on the second metal layer 137, and the indium tin oxide layer 139 formed on the second silicon nitride layer 138. In the illustrated embodiment, the flexible substrate 110 is a polyimide (PI) substrate.

The projection of the first metal layer 135 on the flexible substrate 110 is overlapped by the projection of the polysilicon layer 133 on the flexible substrate 110. The projection of the second metal layer 137 on the flexible substrate 110 occupies all the areas that are not occupied by the projection of the polysilicon layer 133 on the flexible substrate 110.

The protection layer 160 is provided between the display device 150 and the film packaging layer 170, the protection layer 160 serves as a protective and buffering member for the display device 150. In the illustrated embodiment, the display device 150 is an organic light-emitting diode (OLED) device.

The sum thickness of the flexible substrate 110, the TFT structure, the display device 150 is in a range of 20 μm to 25 μm.

The thickness uniformity of the curing material layer 190 is greater than 90%. The material used in the curing material layer 190 is a curing material having high transparency and low temperature curing. The used curing material can be epoxy or acrylate and the like.

The curing material layer 190 includes a specific region 141, a projection of which on the flexible substrate 110 is overlapped by a projection of the non-metal layer region on the flexible substrate 110. In the illustrated embodiment, other than the overlapped region of the projection on the flexible substrate 110 and a projection of the polysilicon region on the flexible substrate 110, the specific region 141 further includes an overlapped region of the projection on the flexible substrate 110 and a projection of the display device 150 on the flexible substrate 110.

The curing material layer 190 is patterned. The specific region 141 of the curing material layer 190 has a thickness greater than a thickness of other regions of the curing material layer 190 other than the specific region 141.

The curing material layer 190 includes a first curing material layer and a second curing material layer, the first curing material layer has a thickness of 1 μm to 100 μm, and the second curing material layer has a thickness of 50 μm to 100 μm.

It should be noted that, the specific region 141 can only be an overlapped region of the projection on the flexible substrate 110 and the projection of the polysilicon region on the flexible substrate 110.

According to the aforementioned the flexible display device 100, the curing material layer 190 is formed on the film packaging layer 170, and the curing material layer 190 is patterned, such that the flexible display device can have a relatively small bending radius without changing the thickness of the film.

Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

Although the description is illustrated and described herein with reference to certain embodiments, the description is not intended to be limited to the details shown. Modifications may be made in the details within the scope and range equivalents of the claims.

What is claimed is:

1. A flexible display device, comprising: a flexible substrate, a TFT structure, a display device, a film packaging layer, and a curing material layer laminated successively on the flexible substrate,
wherein the TFT structure comprises a non-metal layer region and a hole region, the curing material layer comprises a specific region, a projection of the specific region on the flexible substrate overlapping a projection of the non-metal layer region on the flexible substrate, the specific region comprises a region of which a projection on the flexible substrate overlaps a projection of the hole region on the flexible substrate; the curing material layer is patterned, and the specific region of the curing material layer has a thickness greater than a thickness of other regions of the curing material layer other than the specific region.

2. The flexible display device according to claim 1, wherein the specific region further comprises a region of which a projection on the flexible substrate overlaps a projection of the display device on the flexible substrate.

3. The flexible display device according to claim 1, wherein the curing material layer comprises a first curing material layer and a second curing material layer, the first curing material layer and the second curing material layer are successively formed on the film packaging layer.

4. The flexible display device according to claim 3, wherein the first curing material layer has a thickness of 1 to 100 μm and the second curing material layer has a thickness of 50 to 100 μm.

5. The flexible display device according to claim 1, wherein a curing material used in the curing material layer comprises epoxy resin or acrylate.

6. A method of manufacturing the flexible display device of claim 1, the method comprising the steps of:
fabricating the thin film transistor (TFT) structure on the flexible substrate, the TFT structure comprising a non-metal layer region and a hole region;
fabricating the display device and the film packaging layer successively on the TFT structure;
forming the curing material layer on the film packaging layer, wherein the curing material layer comprises a specific region, a projection of the specific region on the flexible substrate overlapping a projection of the non-metal layer region on the flexible substrate, the specific region comprises a region of which a projection on the flexible substrate overlaps a projection of the hole region on the flexible substrate; and
patterning the curing material layer, such that the specific region of the curing material layer has a thickness greater than a thickness of other regions of the curing material layer other than the specific region.

7. The method of manufacturing the flexible display device according to claim 6, wherein in the forming the curing material layer on the film packaging layer, the specific region further comprises a region of which a projection on the flexible substrate overlaps a projection of the display device on the flexible substrate.

8. The method of manufacturing the flexible display device according to claim 6, wherein in the forming the curing material layer on the film packaging layer, the curing material layer comprises a first curing material layer and a second curing material layer, the first curing material layer and the second curing material layer are successively formed on the film packaging layer.

9. The method of manufacturing the flexible display device according to claim 6, wherein a curing material used in the curing material layer comprises epoxy resin or acrylate.

10. The method of manufacturing the flexible display device according to claim 8, wherein the forming the curing material layer on the film packaging layer further comprises:
coating a first curing material on the film packaging layer, curing the first curing material completely according to a first curing condition to form the first curing material layer; and
coating a second curing material on the first curing material layer, semi-curing the second curing material according to a second curing condition to form a semi-curing material layer.

11. The method of manufacturing the flexible display device according to claim 10, wherein the patterning the curing material layer, such that the specific region of the curing material layer has the thickness greater than the thickness of other regions of the curing material layer other than the specific region comprises:
   patterning the semi-curing material layer by exposure and development to obtain the patterned semi-curing material layer;
   curing the patterned semi-curing material layer according to a third curing condition to form the second curing material layer.

12. The method of manufacturing the flexible display device according to claim 10, wherein the first curing condition includes a curing temperature being 100° C. to 150° C., and a curing time of 0.5 to 2 hours; the second curing condition includes: a curing temperature being 100° C. to 150° C., and a curing time of 1 to 30 minutes.

13. The method of manufacturing the flexible display device according to claim 10, wherein the first curing material layer has a thickness of 1 to 100 μm; the second curing material layer has a thickness of 50 to 100 μm.

14. The method of manufacturing the flexible display device according to claim 11, wherein the third curing condition includes: a curing temperature being 100° C., and a curing time of 0.5 to 2 hours.

15. The flexible display device according to claim 1, wherein the curing material layer is patterned to have the specific region of the curing material layer protruded to a direction away from the flexible substrate, thereby having the thickness greater than the thickness of other regions of the curing material layer other than the specific region.

\* \* \* \* \*